(12) United States Patent
Maleki et al.

(10) Patent No.: US 8,976,822 B2
(45) Date of Patent: Mar. 10, 2015

(54) TUNABLE OPTO-ELECTRONIC OSCILLATOR HAVING OPTICAL RESONATOR FILTER OPERATING AT SELECTED MODULATION SIDEBAND

(71) Applicant: OEwaves, Inc., Pasadena, CA (US)

(72) Inventors: Lute Maleki, Pasadena, CA (US); David Seidel, Alta Loma, CA (US); Vladimir Ilchenko, Arcadia, CA (US); Danny Eliyahu, Pasadena, CA (US); Anatoliy Savchenkov, Glendale, CA (US); Andrey Matsko, Pasadena, CA (US)

(73) Assignee: OEwaves, Inc., Pasadena, CA (US)

( * ) Notice: Subject to any disclaimer, the term of this patent is extended or adjusted under 35 U.S.C. 154(b) by 0 days.

(21) Appl. No.: 13/830,307

(22) Filed: Mar. 14, 2013

(65) Prior Publication Data
US 2013/0259072 A1  Oct. 3, 2013

Related U.S. Application Data

(60) Provisional application No. 61/616,345, filed on Mar. 27, 2012.

(51) Int. Cl.
*H01S 3/10* (2006.01)
*H01S 3/13* (2006.01)
(Continued)

(52) U.S. Cl.
CPC .............. *H01S 3/1305* (2013.01); *H01S 5/0656* (2013.01); *H03B 17/00* (2013.01); *G02F 1/01* (2013.01)
USPC ............ 372/20; 372/26; 372/28; 372/29.011; 372/32

(58) Field of Classification Search
CPC ....... H01S 3/00; H01S 3/0014; H01S 3/0085; H01S 3/10; H01S 5/00; H01S 5/0035; H01S 5/0078; H01S 5/0085; H01S 5/0068
USPC ......................................... 372/20, 26, 28, 29
See application file for complete search history.

(56) References Cited

U.S. PATENT DOCUMENTS

| 5,204,640 A | 4/1993 | Logan, Jr. |
| 5,220,292 A | 6/1993 | Bianchini et al. |

(Continued)

FOREIGN PATENT DOCUMENTS

| WO | 01/96936 A1 | 12/2001 |
| WO | 2005/038513 | 4/2005 |

(Continued)

OTHER PUBLICATIONS

Braginsky, V.B., et al., "Quality-Factor and Nonlinear Properties of Optical Whispering-Gallery Modes," Physics Letters A, 137(7, 8):393-397, May 1989.

(Continued)

*Primary Examiner* — Dung Nguyen
(74) *Attorney, Agent, or Firm* — Fish & Tsang, LLP

(57) ABSTRACT

Opto-electronic oscillator (OEO) devices include an optical resonator filter to block the strong laser light at the laser carrier frequency from entering the optical resonator filter and to select one of the weak modulation sidebands, which is in resonance with the optical resonator filter, to be coupled into the optical resonator filter. The laser light at the laser carrier frequency and other modulation sidebands bypass the optical resonator filter to reach a fast photodetector. The laser light in the selected modulation sideband in the optical resonator filter is then coupled out to mix with the laser light at the laser carrier frequency and other modulation sidebands at the fast photodetector to produce the detector output as the input to the electrical part of the opto-electronic loop to produce the OEO oscillation.

18 Claims, 9 Drawing Sheets

(51) Int. Cl.
  *H01S 5/065* (2006.01)
  *H03B 17/00* (2006.01)
  *G02F 1/01* (2006.01)

(56) References Cited

U.S. PATENT DOCUMENTS

| | | | |
|---|---|---|---|
| 5,723,856 A | 3/1998 | Yao et al. |
| 5,751,747 A | 5/1998 | Lutes et al. |
| 5,777,778 A | 7/1998 | Yao |
| 5,917,179 A | 6/1999 | Yao |
| 5,929,430 A | 7/1999 | Yao et al. |
| 5,985,166 A | 11/1999 | Unger et al. |
| 6,080,586 A | 6/2000 | Baldeschwieler et al. |
| 6,178,036 B1 | 1/2001 | Yao |
| 6,203,660 B1 | 3/2001 | Unger et al. |
| 6,389,197 B1 | 5/2002 | Iltchenko et al. |
| 6,417,957 B1 | 7/2002 | Yao |
| 6,473,218 B1 | 10/2002 | Maleki et al. |
| 6,476,959 B2 | 11/2002 | Yao |
| 6,487,233 B2 | 11/2002 | Maleki et al. |
| 6,488,861 B2 | 12/2002 | Iltchenko et al. |
| 6,490,039 B2 | 12/2002 | Maleki et al. |
| 6,535,328 B2 | 3/2003 | Yao |
| 6,567,436 B1 | 5/2003 | Yao et al. |
| 6,580,532 B1 | 6/2003 | Yao et al. |
| 6,594,061 B2 | 7/2003 | Huang et al. |
| 6,762,869 B2 | 7/2004 | Maleki et al. |
| 6,795,481 B2 | 9/2004 | Maleki et al. |
| 6,798,947 B2 | 9/2004 | Iltchenko |
| 6,853,479 B1 | 2/2005 | Ilchenko et al. |
| 6,871,025 B2 | 3/2005 | Maleki et al. |
| 6,873,631 B2 | 3/2005 | Yao et al. |
| 6,879,752 B1 | 4/2005 | Ilchenko et al. |
| 6,901,189 B1 | 5/2005 | Savchenkov et al. |
| 6,906,309 B2 | 6/2005 | Sayyah et al. |
| 6,922,497 B1 | 7/2005 | Savchenkov et al. |
| 6,928,091 B1 | 8/2005 | Maleki et al. |
| 6,943,934 B1 | 9/2005 | Ilchenko et al. |
| 6,987,914 B2 | 1/2006 | Savchenkov et al. |
| 7,024,069 B2 | 4/2006 | Savchenkov et al. |
| 7,043,117 B2 | 5/2006 | Matsko et al. |
| 7,050,212 B2 | 5/2006 | Matsko et al. |
| 7,061,335 B2 | 6/2006 | Maleki et al. |
| 7,062,131 B2 | 6/2006 | Ilchenko |
| 7,092,591 B2 | 8/2006 | Savchenkov et al. |
| 7,133,180 B2 | 11/2006 | Ilchenko et al. |
| 7,173,749 B2 | 2/2007 | Maleki et al. |
| 7,184,451 B2 | 2/2007 | Ilchenko et al. |
| 7,187,870 B2 | 3/2007 | Ilchenko et al. |
| 7,218,662 B1 | 5/2007 | Ilchenko et al. |
| 7,248,763 B1 | 7/2007 | Kossakovski et al. |
| 7,260,279 B2 | 8/2007 | Gunn et al. |
| 7,283,707 B1 | 10/2007 | Maleki et al. |
| 7,356,214 B2 | 4/2008 | Ilchenko |
| 7,362,927 B1 | 4/2008 | Ilchenko et al. |
| 7,369,722 B1 | 5/2008 | Yilmaz et al. |
| 7,389,053 B1 | 6/2008 | Ilchenko et al. |
| 7,400,796 B1 | 7/2008 | Kossakovski et al. |
| 7,440,651 B1 | 10/2008 | Savchenkov et al. |
| 7,460,746 B2 | 12/2008 | Maleki et al. |
| 7,480,425 B2 | 1/2009 | Gunn et al. |
| 7,587,144 B2 | 9/2009 | Ilchenko et al. |
| 7,630,417 B1 | 12/2009 | Maleki et al. |
| 7,634,201 B2 | 12/2009 | Maleki et al. |
| 7,801,189 B2 | 9/2010 | Maleki et al. |
| 7,813,651 B2 | 10/2010 | Ilchenko et al. |
| 7,869,472 B2 | 1/2011 | Maleki et al. |
| 7,929,589 B1 | 4/2011 | Ilchenko et al. |
| 7,965,745 B2 | 6/2011 | Maleki et al. |
| 7,991,025 B2 | 8/2011 | Maleki et al. |
| 8,089,684 B1 | 1/2012 | Koonath et al. |
| 8,094,359 B1 | 1/2012 | Matsko et al. |
| 8,102,597 B1 | 1/2012 | Maleki et al. |
| 8,111,722 B1 | 2/2012 | Maleki et al. |
| 8,155,913 B2 | 4/2012 | Eliyahu et al. |
| 8,155,914 B2 | 4/2012 | Eliyahu et al. |
| 8,159,736 B2 | 4/2012 | Maleki et al. |
| 8,289,616 B1 | 10/2012 | Maleki et al. |
| 8,311,376 B1 | 11/2012 | Maleki et al. |
| 8,331,008 B1 | 12/2012 | Matsko et al. |
| 8,331,409 B1 | 12/2012 | Liang et al. |
| 8,417,076 B2 | 4/2013 | Maleki et al. |
| 8,442,088 B1 | 5/2013 | Ilchenko et al. |
| 8,452,139 B1 | 5/2013 | Matsko et al. |
| 8,498,539 B1 | 7/2013 | Ilchenko et al. |
| 8,514,400 B2 | 8/2013 | Mohageg et al. |
| 8,538,270 B2 | 9/2013 | Seidel et al. |
| 8,564,869 B1 | 10/2013 | Mohageg et al. |
| 8,605,760 B2 | 12/2013 | Liang et al. |
| 8,659,814 B2 | 2/2014 | Matsko et al. |
| 8,681,827 B2 | 3/2014 | Maleki et al. |
| 8,761,555 B2 | 6/2014 | Matsko et al. |
| 8,761,603 B1 | 6/2014 | Maleki |
| 2001/0038651 A1 | 11/2001 | Maleki et al. |
| 2002/0018611 A1 | 2/2002 | Maleki et al. |
| 2002/0018617 A1 | 2/2002 | Iltchenko et al. |
| 2002/0021765 A1 | 2/2002 | Maleki et al. |
| 2002/0081055 A1 | 6/2002 | Painter et al. |
| 2002/0085266 A1 | 7/2002 | Yao |
| 2002/0097401 A1 | 7/2002 | Maleki et al. |
| 2003/0160148 A1 | 8/2003 | Yao et al. |
| 2004/0100675 A1 | 5/2004 | Matsko et al. |
| 2004/0109217 A1 | 6/2004 | Maleki et al. |
| 2004/0218880 A1 | 11/2004 | Matsko et al. |
| 2004/0240781 A1 | 12/2004 | Savchenkov et al. |
| 2005/0017816 A1 | 1/2005 | Ilchenko et al. |
| 2005/0063034 A1 | 3/2005 | Maleki et al. |
| 2005/0074200 A1 | 4/2005 | Savchenkov et al. |
| 2005/0123306 A1* | 6/2005 | Ilchenko et al. ............ 398/161 |
| 2005/0128566 A1 | 6/2005 | Savchenkov et al. |
| 2005/0175358 A1 | 8/2005 | Ilchenko et al. |
| 2005/0248823 A1 | 11/2005 | Maleki et al. |
| 2006/0262386 A1 | 11/2006 | Jungerman |
| 2007/0009205 A1 | 1/2007 | Maleki et al. |
| 2007/0153289 A1 | 7/2007 | Yilmaz et al. |
| 2008/0001062 A1 | 1/2008 | Gunn et al. |
| 2008/0075464 A1 | 3/2008 | Maleki et al. |
| 2008/0310463 A1 | 12/2008 | Maleki et al. |
| 2009/0097516 A1 | 4/2009 | Maleki et al. |
| 2009/0135860 A1 | 5/2009 | Maleki et al. |
| 2009/0208205 A1 | 8/2009 | Eliyahu et al. |
| 2009/0251705 A1 | 10/2009 | Le et al. |
| 2009/0310629 A1 | 12/2009 | Maleki et al. |
| 2009/0324251 A1 | 12/2009 | Ilchenko et al. |
| 2010/0118375 A1 | 5/2010 | Maleki et al. |
| 2011/0110387 A1 | 5/2011 | Maleki et al. |
| 2011/0150485 A1 | 6/2011 | Seidel et al. |
| 2011/0255094 A1 | 10/2011 | Mohageg et al. |
| 2011/0292486 A1 | 12/2011 | Delfyett et al. |
| 2012/0039346 A1 | 2/2012 | Liang et al. |
| 2012/0194893 A1 | 8/2012 | Maleki et al. |
| 2012/0195590 A1 | 8/2012 | Eliyahu et al. |
| 2012/0294319 A1 | 11/2012 | Maleki et al. |
| 2012/0320449 A1 | 12/2012 | Savchenkov et al. |
| 2012/0327497 A1 | 12/2012 | Matsko et al. |
| 2013/0003766 A1 | 1/2013 | Savchenkov et al. |
| 2013/0259072 A1 | 10/2013 | Maleki et al. |

FOREIGN PATENT DOCUMENTS

| | | |
|---|---|---|
| WO | 2005/067690 A2 | 7/2005 |
| WO | 2005/122346 A2 | 12/2005 |
| WO | 2006/076585 A2 | 7/2006 |
| WO | 2007/143627 A2 | 12/2007 |

OTHER PUBLICATIONS

Eliyahu, D., et al., "Low Phase Noise and Spurious Levels in Multi-Loop Opto-Electronic Oscillators," Proceedings of the 2003 IEEE International Frequency Control Symposium and PDA Exhibition, pp. 405-410, May 2003.

Eliyahu, D., et al., "Modulation Response (S21) of the Coupled Opto-Electronic Oscillator," Proceedings of the 2005 IEEE Interna-

(56) References Cited

OTHER PUBLICATIONS tional Frequency Control Symposium and Exposition, pp. 850-856, Aug. 2005.
Eliyahu, D., et al., "Tunable, Ultra-Low Phase Noise YIG Based Opto-Electronic Oscillator," IEEE MTT-S International Microwave Symposium Digest, 3:2185-2187, Jun. 2003.
Gorodetsky, M.L., et al., "Optical Microsphere Resonators: Optimal Coupling to High-Q Whispering-Gallery Modes," J. Opt. Soc. Am. B, 16(1):147-154, Jan. 1999.
Gorodetsky, M.L., et al., "Rayleigh Scattering in High-Q Microspheres," J. Opt. Soc. Am. B, 17(6):1051-1057, Jun. 2000.
Gorodetsky, M.L., et al., "Ultimate Q of Optical Microsphere Resonators," Optics Letters, 21(7):453-455, Apr. 1996.
Hryniewicz, J.V., et al., "Higher Order Filter Response in Coupled Microring Resonators," IEEE Photonics Technology Letters, 12(3):320-322, Mar. 2000.
Huang, S., et al., "A 'Turnkey' Optoelectronic Oscillator with Low Acceleration Sensitivity," 2000 IEEE/EIA International Frequency Control Symposium and Exhibition, pp. 269-279, Jun. 2000.
Ilchenko V., et al., "Electrooptically Tunable Photonic Microresonators and Photonic Bandgap Waveguide Coupling for Micro-Optoelectronic Oscillators," GOMACTech 2003, Tampa, Florida, pp. 1-4.
Ilchenko, V., et al., "High-Q Microsphere Cavity for Laser Stabilization and Optoelectronic Microwave Oscillator," Proceedings SPIE Microresonators and Whispering-Gallery Modes, vol. 3611, pp. 190-198, Jan. 1999.
Ilchenko, V., et al., "Microsphere Integration in Active and Passive Photonics Devices," Proc. of SPIE Laser Resonators III, vol. 3930, pp. 154-162, Jan. 2000.
Ilchenko, V., et al., "Microtorus: A High-Finesse Microcavity with Whispering-Gallery Modes," Optics Letters, 26 (5):256-258, Mar. 2001.
Ilchenko, V., et al., "Pigtailing the High-Q Microsphere Cavity: A Simple Fiber Coupler for Optical Whispering-Gallery Modes," Optics Letters, 24(11):723-725, Jun. 1999.
Ilchenko, V., et al., "Sub-Micro Watt Photonic Microwave Receiver," IEEE Photonics Technology Letters, 14 (11):1602-1604, Nov. 2002.
Ilchenko, V., et al., "Tunability and Synthetic Lineshapes in High-Q Optical Whispering Gallery Modes," Proc. of SPIE Laser Resonators and Beam Control VI, vol. 4969, pp. 195-206, Jan. 2003.
Ilchenko, V., et al., "Whispering-Gallery-Mode Electro-Optic Modulator and Photonic Microwave Receiver," J. Opt. Soc. Am. B, 20(2):333-342, Feb. 2003.
Ito, H., et al., "InP/InGaAs Uni-Travelling-Carrier Photodiode with 310 GHz Bandwidth," Electronics Letters, 36 (21):1809-1810, Oct. 2000.
Logan, R., et al., "Stabilization of Oscillator Phase Using a Fiber-Optic Delay-Line," IEEE 45th Annual Symposium on Frequency Control, pp. 508-512, May 1991.
Maleki, L., "The Opto-Electronic Oscillator: Prospects for Extending the State of the Art in Reference Frequency Generation," International Topical Meeting on Microwave Photonics, pp. 195-198, Oct. 1998.
Matsko, A., et al., "Active Mode Locking with Whispering-Gallery Modes," J. Opt. Soc. Am. B, 20(11):2292-2296, Nov. 2003.
Matsko, A., et al., "Whispering-Gallery-Mode based Optoelectronic Microwave Oscillator," Journal of Modern Optics, 50(15-17):2523-2542, Feb. 2004.
Matsko, A., et al., "Whispering-Gallery-Mode Resonators as Frequency References. I. Fundamental Limitations," J. Opt. Soc. Am. B, 24(6):1324-1335, Jun. 2007.
Myers, L.E., et al., "Quasi-Phase-Matched Optical Parametric Oscillators in Bulk Periodically Poled LiNbO3," J. Opt. Soc. Am. B, 12(11):2102-2116, Nov. 1995.
Savchenkov, A., et al., "RF photonic signal processing components: From high order tunable filters to high stability tunable oscillators," IEEE Radar Conference, pp. 1-6, May 2009.
Savchenkov, A., et al., "Tunable Resonant Single-Sideband Electro-Optical Modulator," Digest of the IEEE/LEOS Summer Topical Meetings, pp. 63-64, Jul. 2009.
Savchenkov, A., et al., "Whispering-Gallery-Mode Resonators as Frequency References. II. Stabilization," J. Opt. Soc. Am. B, 24(12): 2988-2997, Dec. 2007.
Vassiliev, V.V., et al., "Narrow-Line-Width Diode Laser with a High-Q Microsphere Resonator," Optics Communications, 158(1-6):305-312, Dec. 1998.
Yao, X.S., et al., "A Novel Photonic Oscillator," Digest of the LEOS Summer Topical Meetings, pp. 17-18, Aug. 1995.
Yao, X.S., et al., "A Novel Photonic Oscillator," TDA Progress Report 42-122, pp. 32-43, Aug. 1995.
Yao, X.S., et al., "Converting Light into Spectrally Pure Microwave Oscillation," Optics Letters, 21(7):483-485, Apr. 1996.
Yao, X.S., et al., "Coupled Optoelectronic Oscillators for Generating Both RF Signal and Optical Pulses," Journal of Lightwave Technology, 18(1):73-78, Jan. 2000.
Yao, X.S., et al., "Dual Microwave and Optical Oscillator," Optics Letters, 22(24):1867-1869, Dec. 1997.
Yao, X.S., et al., "Multiloop Optoelectronic Oscillator," IEEE Journal of Quantum Electronics, 36(1):79-84, Jan. 2000.
Yao, X.S., et al., "Optoelectronic Microwave Oscillator," J. Opt. Soc. Am. B, 13(8):1725-1735, Aug. 1996.
Yao, X.S., et al., "Optoelectronic Oscillator for Photonic Systems," IEEE Journal of Quantum Electronics, 32 (7):1141-1149, Jul. 1996.
Yu, J., et al., "Compact Optoelectronic Oscillator with Ultra-Low Phase Noise Performance," Electronics Letters, 35 (18):1554-1555, Sep. 1999.
Kim, T., International Search Report and Written Opinion, PCT Application No. PCT/US2013/031683, Jun. 28, 2013, 9 pages.

\* cited by examiner

TUNABLE OPTO-ELECTRONIC OSCILLATOR HAVING OPTICAL RESONATOR FILTER OPERATING AT SELECTED MODULATION SIDEBAND

PRIORITY CLAIM AND CROSS REFERENCE TO RELATED APPLICATION

This patent document claims the benefit of U.S. Provisional Patent Application No. 61/616,345, entitled "Tunable Opto-Electronic Oscillator based on Phase Modulator and Optical Microresonator" and filed Mar. 27, 2012, which is incorporated herein by reference in its entirety.

BACKGROUND

This patent document relates to oscillators based on optical and photonic devices for various applications, such as optical, radio frequency (RF), and microwave applications.

Optical devices may be used to manipulate or control light for applications where signals are not in the optical frequencies. As an example, RF and microwave oscillators for generating signals in the RF and microwave frequencies may be constructed as "hybrid" devices by using both electronic and optical components to form opto-electronic oscillators ("OEOs"). See, e.g., U.S. Pat. Nos. 5,723,856; 5,777,778; 5,929,430 and 6,567,436. Such an OEO includes an electrically controllable optical modulator and at least one active opto-electronic feedback loop that includes an optical part and an electrical part interconnected by a photodetector. The optical part of the opto-electronic feedback loop receives the modulated optical output from the optical modulator and the photodetector converts the light in the optical part into an electrical signal in the electrical part which is then used to produce a modulation control signal that controls the optical modulator. The feedback loop produces a desired long delay, e.g., in the optical part of the loop, to suppress phase noise and feeds the converted electrical signal in phase to the optical modulator to generate and sustain both optical modulation and electrical oscillation in RF or microwave frequencies when the total loop gain of the active opto-electronic loop exceeds the total loss. The generated oscillating signals are tunable in frequency and can have narrow spectral linewidths and low phase noise in comparison with the signals produced by other RF and microwaves oscillators.

SUMMARY

Opto-electronic oscillator (OEO) devices include an optical resonator filter to block the strong laser light at the laser carrier frequency from entering the optical resonator filter and to select one of the weak modulation sidebands, which is in resonance with the optical resonator filter, to be coupled into the optical resonator filter. The laser light at the laser carrier frequency and other modulation sidebands bypass the optical resonator filter to reach a fast photodetector. The laser light in the selected modulation sideband in the optical resonator filter is then coupled out to mix with the laser light at the laser carrier frequency and other modulation sidebands at the fast photodetector to produce the detector output as the input to the electrical part of the opto-electronic loop to produce the OEO oscillation.

DETAILED DESCRIPTION

Figure 1:
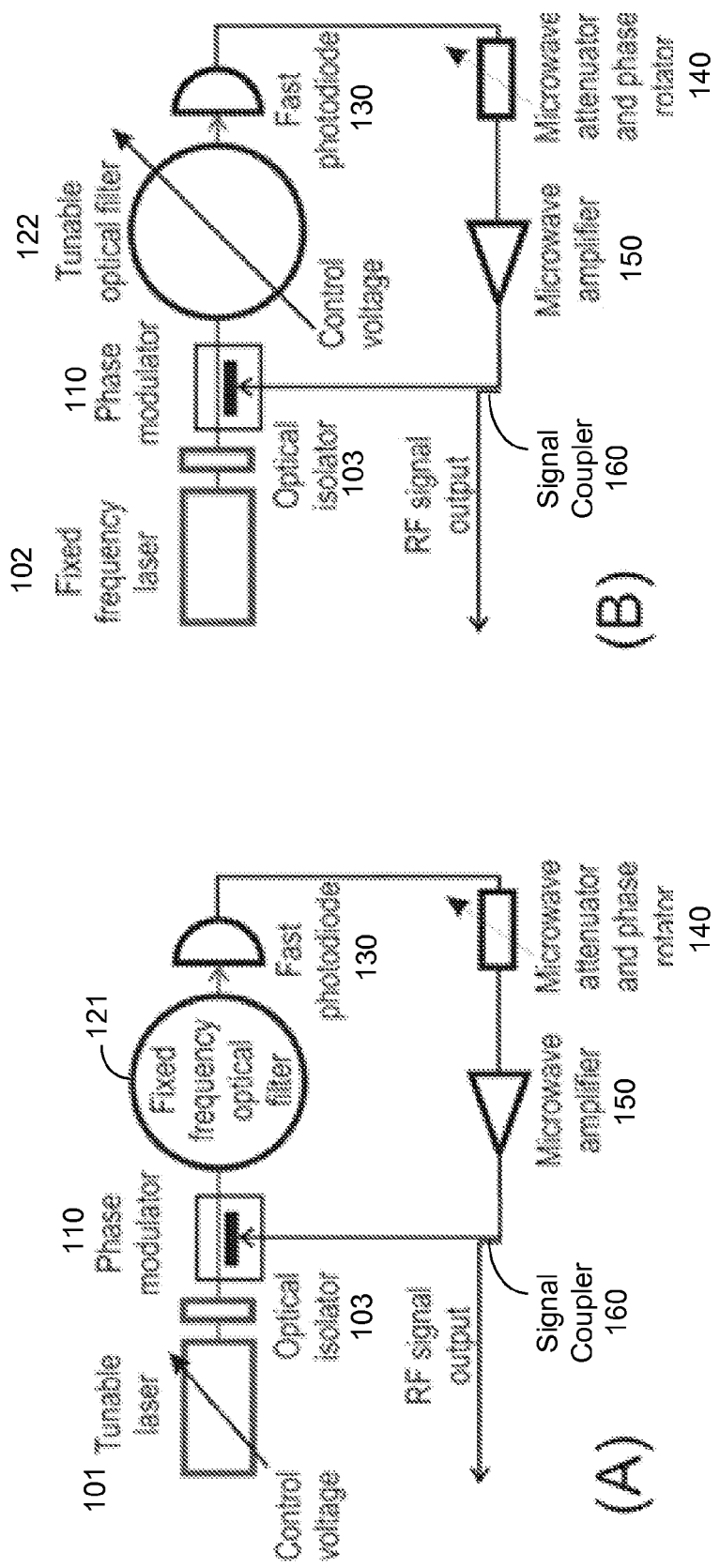
FIG. 1 shows two examples of opto-electronic oscillator (OEO) devices.

The opto-electronic oscillator (OEO) devices described here use an optical modulator, e.g., an optical phase modulator, to modulate a continuous wave (CW) laser light beam from a laser at a laser carrier frequency. This optical modulation produces optical modulation sidebands at frequencies different from the laser carrier frequency. As a result of the optical modulation, the modulated laser light includes strong laser light at the laser carrier frequency and weak laser light at the optical modulation sidebands. Various opto-electronic oscillator devices can be designed to include an optical resonator in the opto-electronic loop where the strong laser light at the laser carrier frequency is in resonance with and is directly coupled into the optical resonator for the opto-electronic oscillation. Some examples of such OEO devices with resonators are disclosed in U.S. Pat. No. 6,567,436 entitled "Opto-electronic oscillators having optical resonators" which is incorporated by reference as part of this document. The opto-electronic oscillator devices described here use an optical resonator filter to block the strong laser light at the laser carrier frequency from entering the optical resonator filter and to select one of the weak modulation sidebands, which is in resonance with the optical resonator filter, to be coupled into the optical resonator filter. The laser light at the laser carrier frequency and other modulation sidebands is directed to bypass the optical resonator filter to reach a fast photodetector. The laser light in the selected modulation sideband in the optical resonator filter is then coupled out to mix with the laser light at the laser carrier frequency and other modulation sidebands at the fast photodetector to produce the detector output as the input to the electrical part of the opto-electronic loop to produce the OEO oscillation.

Under this design, the OEO oscillation frequency of such an opto-electronic oscillator device is determined by the frequency difference between the laser carrier frequency and the resonance frequency of the optical resonator filter (in resonance with the selected sideband modulation) and can be tuned by tuning either the laser carrier frequency or the resonance frequency of the optical resonator filter. In another aspect, different from other opto-electronic oscillator devices which feed laser light at the laser carrier frequency into the optical resonator filter to produce an OEO oscillation frequency in the opto-electronic loop equal to the free spectral range (FSR) of the optical resonator filter or the multiplicity of the FSR, the OEO oscillation frequency of the opto-electronic loop in the opto-electronic oscillator devices described here can be independent of the FSR of the optical resonator filter and can be at any frequency within the bandwidth of the fast photodetector. This independence of the OEO oscillation frequency from the FSR of the optical resonator filter allows the OEO oscillation frequency to be widely tuned and to be at high frequencies, including, e.g., the W-band from 75 GHz to 110 GHz. Based on this independence between the FSR of the optical resonator filter and the OEO oscillation frequency of the opto-electronic loop, the optical resonator filter can be designed to be physically compact or small (yielding large FSR values) so that the optical resonator filter is less sensitive to an acceleration or vibrations. Consequently, such a device tends to exhibit improved immunity to an acceleration or vibrations.

In addition, the selective coupling of the weak laser light at the selected modulation sideband into the optical resonator filter without having the strong laser light at the laser carrier frequency inside the optical resonator filter can substantially reduce the undesired optical absorption induced thermal effects and undesired optical nonlinearities in the optical resonator filter. This feature can be used to improve the linearity of the optical part of the opto-electronic loop.

Figure 2:
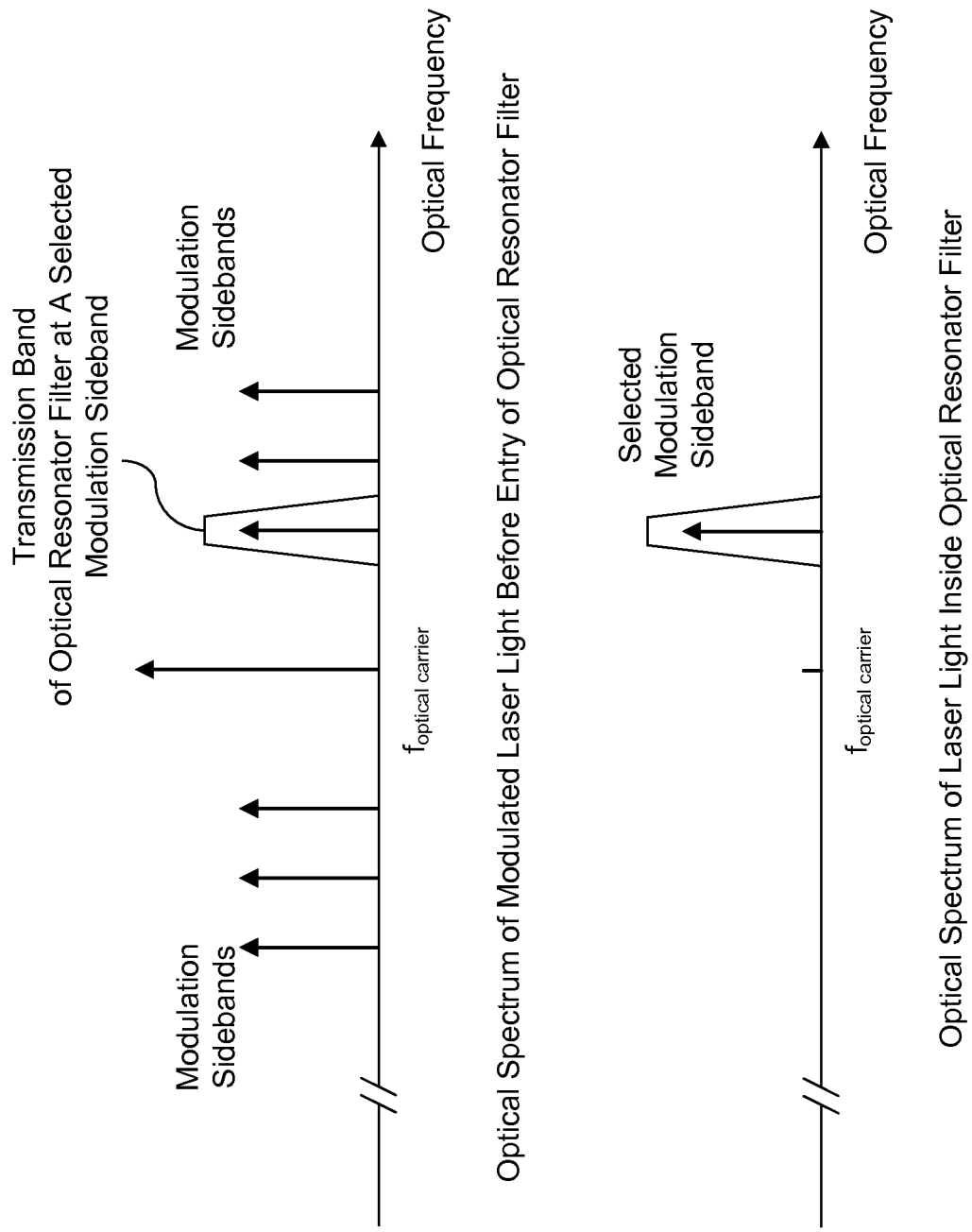
FIG. 2 shows one example of signal spectra in the devices in FIG. 1.

FIG. 1 shows two examples of opto-electronic oscillator devices that selectively couple a modulation sideband into an optical resonator filter while blocking the laser at the laser carrier frequency and other modulation sidebands from entering the optical resonator filter. A laser 101 or 102, e.g., a CW semiconductor laser, is used to produce laser light at a carrier laser frequency. An optical phase modulator 110 is used to receive the laser light at the carrier laser frequency and to perform optical phase modulation under a control of and in response to a modulation control signal. This phase modulation produces modulated laser light having spectral components at the laser carrier frequency and modulation sidebands at frequencies different from the laser carrier frequency. The optical phase modulator 110 may be replaced by an optical modulator that modulates both the phase and the amplitude of light. FIG. 2 illustrates various spectral components of the modulated laser light at the output of the phase modulator 110. To ensure the optical stability of the laser 101 or 102, an optical isolator 103 may be placed at the output of the laser to prevent any optical feedback into the laser.

In both examples in FIG. 1, as illustrated in FIG. 2, an optical resonator filter 121 or 122 is positioned to receive the modulated laser light from the optical modulator and configured to be in optical resonance with a selected modulation sideband of the modulated laser light to selectively receive and output filtered laser light at the selected modulation sideband while blocking laser light at the laser carrier frequency and other modulation sidebands from entering the optical resonator filter 121 or 122. The blocked laser light at the laser carrier frequency and other modulation sidebands is directed to bypass the optical resonator filter without experiencing any significant change and is directed to reach an optical detector or fast photodetector 130 which is the interface between the optical part and the electrical part of the opto-electronic loop. The light inside the optical resonator filter 121 or 122 is coupled out as the filtered laser light. This filtered laser light is in resonance with the optical resonator filter at the selected modulation sideband and is modified in phase and amplitude by the optical resonator filter 121 or 122. The filtered laser light is directed to mix with the laser light at the laser carrier frequency and other modulation sidebands at the fast photodetector 130 which produces an electrical detector signal.

In FIG. 1, a feedback electronic circuit is coupled between the optical detector 130 and the optical phase modulator 110 to amplify the electrical detector signal and to produce an electrical feedback signal as the modulation control signal that is fed into the optical phase modulator 110 to produce a total signal gain greater than a total signal loss in a closed opto-electronic loop that includes (1) an optical section formed by the optical modulator, the optical resonator filter and the optical detector and (2) an electrical section formed by the optical detector and the feedback electronic circuit to sustain an OEO oscillation in the closed opto-electronic loop. This feedback electronic circuit can be in various configurations. In the examples in FIG. 1, the feedback electronic circuit includes a signal attenuator (e.g., a microwave attenuator), a phase adjustment device or rotator 140, and a signal amplifier 150 (e.g., a microwave amplifier). A signal coupler 160 can be included in the feedback electronic circuit to provide an RF or microwave output signal.

Since frequencies of the modulation sidebands produced by the phase modulator 110 are dictated by and change with the laser carrier frequency of the laser 101 or 102, the mixing of the filtered laser light at the selected modulation sideband and the laser light at the laser carrier frequency and other modulation sidebands at the fast photodetector 130 produces beat signals at frequencies in the RF or microwave range based on the frequency difference between the laser carrier frequency and the resonance frequency of the optical resonator filter (in resonance with the selected sideband modulation). The OEO oscillation frequency is selected from one of such beat signal frequencies and can be tuned by tuning either the laser carrier frequency or the resonance frequency of the optical resonator filter. The example A in FIG. 1 uses a tunable laser 101 that can tune its laser carrier frequency in response to a control voltage or current signal for tuning the OEO oscillation frequency and a fixed frequency optical resonator filter 121 that has a fixed resonance frequency for the selected modulation sideband. The example B in FIG. 1 uses a fixed frequency laser 102 producing a fixed laser carrier frequency and a tunable optical resonator filter 122 that can tune its resonance frequency in response to a control signal such as a control voltage in tuning the OEO oscillation frequency. Such an oscillator becomes viable by using a clean electro-optical material to fabricate a resonator that combines a narrow bandwidth and a broad spectral tunability. In other implementations, both a tunable laser and a tunable optical resonator filter can be used to tune the OEO oscillation frequency.

The above closed opto-electronic loop formed by the optical phase modulator 110, the optical resonator filter 121 or 122, the optical detector 130 and the feedback electronic circuit is configured to feedback at any location within the loop with a positive or in-phase feedback and this in-phase feedback condition and the condition of having the total loop gain greater than the total loop loss cause the OEO oscillation and sustain the OEO oscillation. The optical resonator filter 121 or 122 with a high Q value provides a long optical delay and a narrow bandwidth filtering to ensure low phase noise in the OEO oscillation. Additional optical delay can be provided by including an optical delay element, e.g., a fiber delay loop as shown in FIG. 3.

The optical resonator filter 121 or 122 can be implemented in various configurations, including various optical resonators such as an optical Fabry-Perot resonator, an optical whispering gallery mode (WGM) resonator formed by a ring, a disk, or a solid sphere or spheroid. The optical resonator filter can be used to change phase, amplitude, or polarization of the selected optical sideband, or a combination of the mentioned above parameters. If the optical modulator 110 is a modulator that outputs modulation sidebands in orthogonal polarizations, the optical resonator filter 121 or 122 can be configured to rotate polarization of the selected modulation sideband that enters the optical resonator filter 121 or 122 so that the output light at the selected modulation sideband from the optical resonator filter 130 can have a polarization component parallel to optical polarization of the laser light at the laser carrier frequency or at least one other modulation sideband to enable optical beating with the output light at the selected modulation sideband from the optical resonator filter 121 or 122 at the photodetector 130.

Such optical resonators can be configured to exhibit high resonator quality factor Q to reduce the noise and to ensure narrow spectral bandwidth of the OEO oscillation. This use of narrowband filtering in the optical domain removes some technical difficulties in achieving sharping and narrow signal filtering in RF or microwave domain. This shows one example of various advantages of the OEO devices based on certain benefits in the optical domain and certain benefits in the electrical domain (RF or microwave).

Figure 3:
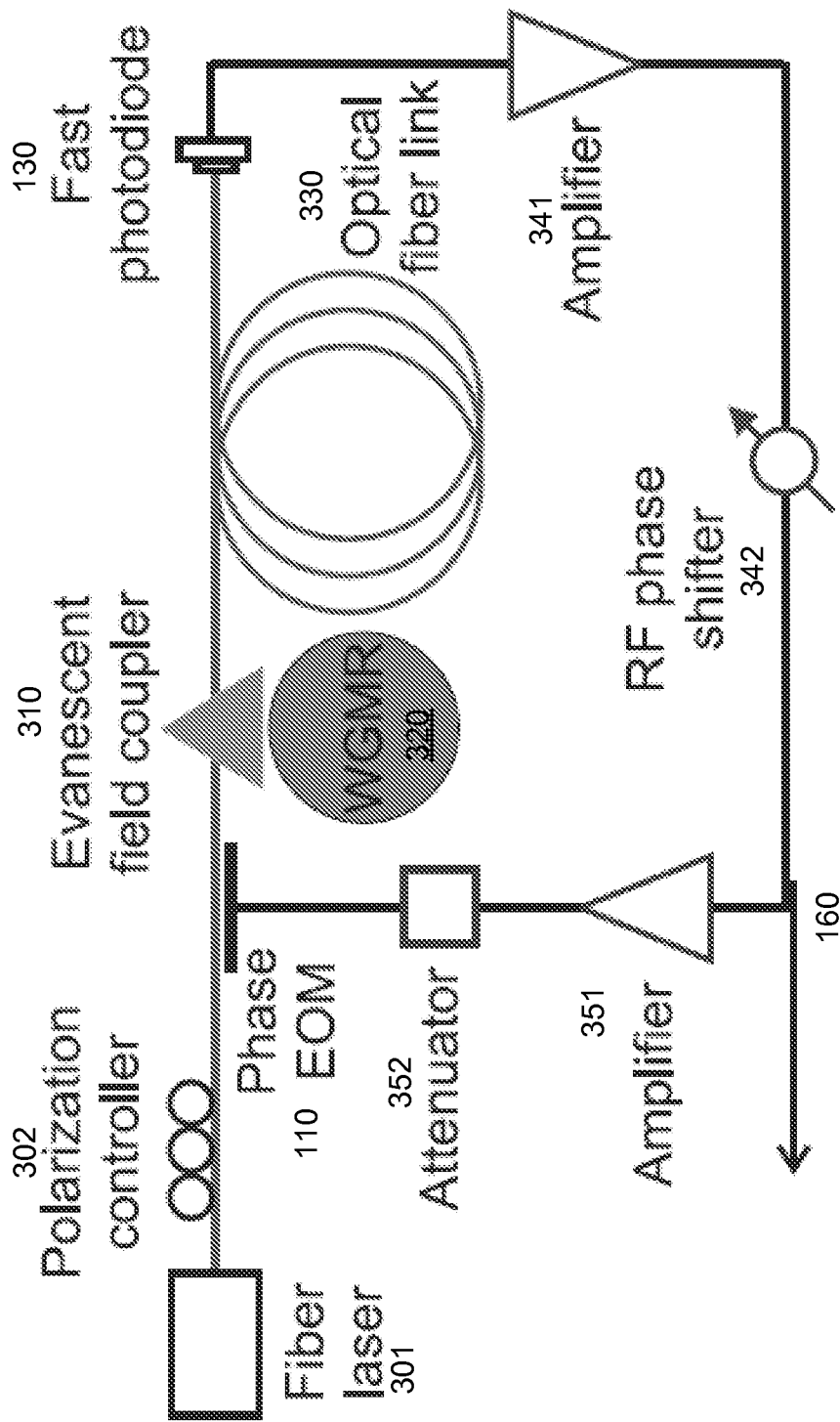
FIG. 3 shows another example of OEO devices based on an electro-optic whispering gallery mode microresonator.

FIG. 3 shows an example of an OEO device based on an optical resonator filter formed of a WGM resonator 320 with an optical evanescent coupler 310. In this example, a laser 301 may be a fiber laser and a polarization controller 302 is provided at the laser output to control the optical polarization of the laser light from the laser 301. The phase modulator 110 is an electro-optic modulator (EOM) to receive the laser light from the polarization controller 302. The modulated laser light from the EOM 110 is directed into the evanescent coupler 310 which can be a prism as illustrated or in other forms to couple a portion of the modulated laser light at a selected modulation sideband in resonance with the WGM resonator 310 into the WGM resonator 310 while directing other laser light (including the laser light at the laser carrier frequency and other modulation sidebands) to bypass the WGM resonator 310 without entering the WGM resonator 310. The evanescent coupler 310 is also used to couple the laser light inside the WGM resonator 310 out as the filtered laser light to co-prorogate the laser light at the laser carrier frequency and other modulation sidebands to reach the optical detector 130. An optical fiber link 330 is coupled between the WGM resonator 320 and the optical detector 130 to provide additional optical delay in the closed OEO loop. The feedback circuit in FIG. 3 includes a signal amplifier 341, an RF phase shifter 342, a signal coupler 160, another amplifier 351 and a signal attenuator 352.

One notable feature of OEO devices is the ability of using the optical section of the OEO loop to provide a long loop delay time. This is important because the phase noise of the OEO devices significantly reduces as the loop delay time increases, e.g., the phase noise may decrease quadratically with the loop delay time. A long delay time is easier to achieve in the optical domain than in the RF or microwave domain. As illustrated in FIG. 3, the optical section of the OEO loop can include a long optical fiber link 330 to increase the loop delay time in the optical part of the OEO loop. This use of fiber loop for long optical delay time can be relatively easy to implement at a relatively low cost and may be used in various OEO devices described in this document. In addition, the phase noise of a signal generated using various other oscillator circuits generally increases linearly with the signal frequency. The OEO devices presented here, however, tend to have their phase noise to be independent of the OEO oscillation frequency. This feature is significant because it allows the generation of high frequency signals at low phase noise, e.g., OEO signals in the W-band from 75 GHz to 110 GHz.

In implementing tunable OEO configurations shown here, light from an agile tunable semiconductor laser can be fed into a broadband phase modulator, then to an ultra-high-Q optical microrezonator, and then to a fast photodiode, to produce an electric signal. The signal from the photodiode is amplified before being fed back to the phase modulator to complete the OEO loop. Self-sustained oscillation starts when the amplification in this feedback loop exceeds the loss. The narrow optical bandwidth of the resonator provides the filter function required for the loop. The change in the laser frequency provides the tunability of the oscillator. The spectral purity depends on the Q of the circuit ensured by the optical microresonator. One of the notable features of such a device is that the device does not require the fundamental frequency of the laser light to pass through the ultra-high-Q optical resonator, as was required in previous implementations of resonator-based OEOs. In the examples described here, only one modulation sideband passes the resonator mode. This feature allows improving the linearity of the optical part of the opto-electronic loop. Moreover, it allows reduction of the resonator size leading to reduction of the vibration sensitivity of the system. In combining a phase modulator in a microresonator-based OEO loop as described here, the free spectral range (FSR) of the resonator can significantly exceed the OEO oscillation frequency to enable small-sized resonators to be implemented without affecting the OEO oscillation frequency range. One of the benefits of this feature is the use of small and light-weight microresonators to reduce the device sensitivity to accelerations or vibrations.

Figure 4:
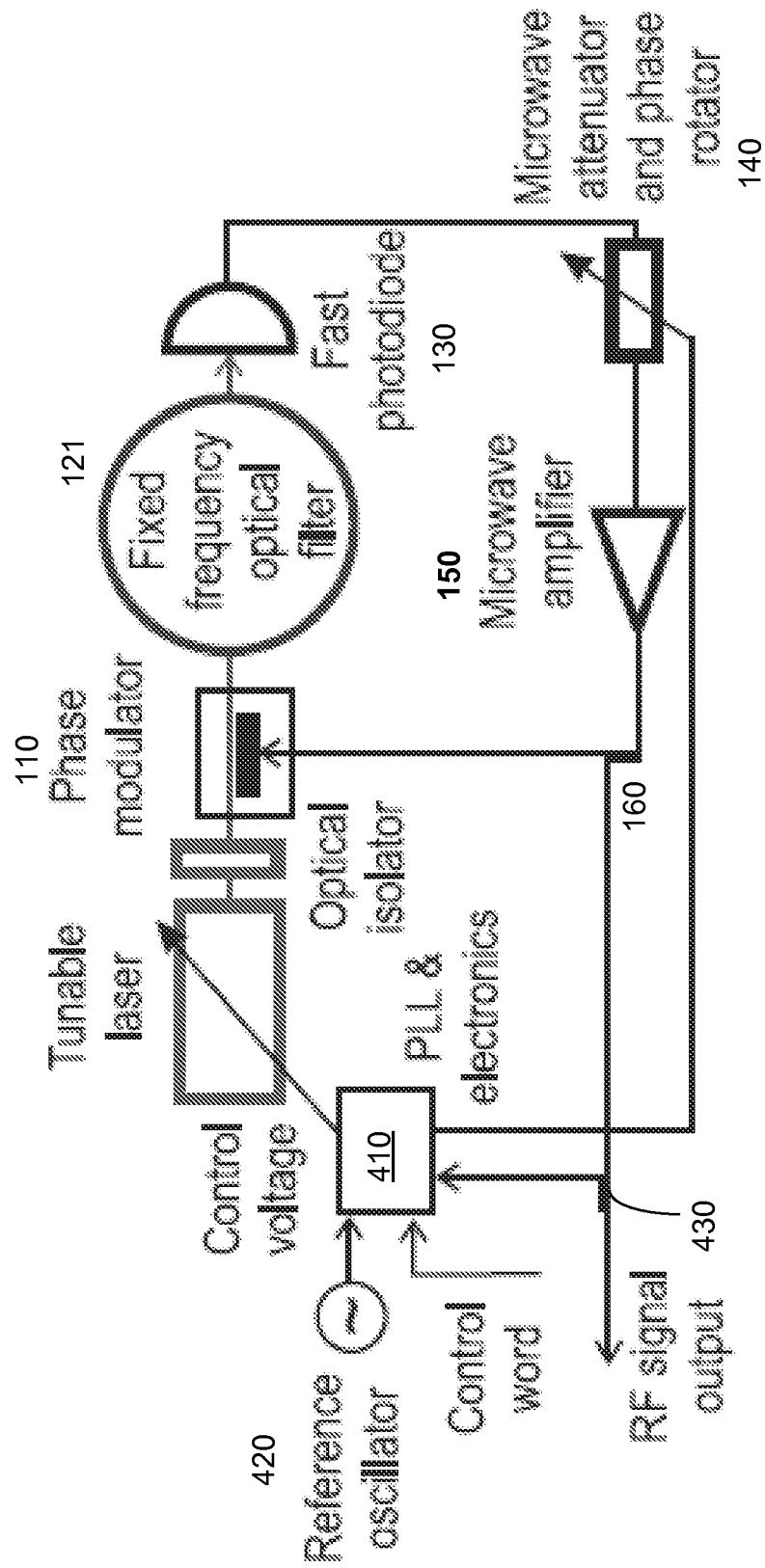
FIG. 4 shows an example of an OEO device having a phase lock loop.

FIG. 4 shows another OEO device example where the oscillator can be locked to an external frequency source using a phase lock loop (PLL) circuit 410 which lock the OEO to a reference oscillator 420 and can be used to tune the oscillator to a desirable OEO oscillation frequency. A signal coupler 430 is provided in the RF signal output produced by the signal coupler 160 in the feedback circuit to split a portion as one of the inputs to the PLL circuit 410. The PLL circuit 410 produces a PLL signal 440 that is applied to adjust the OEO loop, e.g., adjusting the phase adjustment device 140. The tuning speed and phase noise of such an oscillator depend on bandwidth of the PLL loop. If the bandwidth exceeds 1 MHz, for example, the oscillator can jump to a desired frequency in less than a microsecond. Its phase noise will be limited by the phase noise of the frequency multiplied master oscillator 420. To achieve the internal low phase noise performance of the oscillator, the bandwidth of the PLL loop should be much narrower, e.g. 100 Hz. Such a bandwidth will restrict the settling time for the low phase noise of the device by 10 ms.

The OEO devices disclosed here can be implemented based on whispering gallery mode (WGM) resonator technology. WGM resonators can be in small axio-symmetric dielectric structures, ranging from 10 microns to about 10 mm in diameter. Whispering gallery modes are localized close to surface of the resonator, and their resonator quality Q values can be affected intrinsic material loss, bending loss, and scattering loss. Microspherical resonators with dimensions in the range of 50 to 500 microns have been fabricated with Q's as high as a few billion. WGM resonators can be made from crystals, without destroying the crystalline structures with high surface quality (e.g., a surface roughness less than 0.2 nm) and negligible surface scattering losses. The Q-factors of these resonators primarily result from the low absorption in optical crystals. Practical advantages of WGM resonator based devices are that (i) crystalline materials are environmentally stable, (ii) there are crystalline materials with desired electro-optic properties, (iii) these devices can be packaged in small form factors.

WGM resonators can be tunable in frequency in various configurations. For example, the tuning may be achieved by thermal control of the resonator whose index, dimension, or both change with temperature, mechanical control of the resonator by changing the dimension of the resonator, electrical control, or optical control. Electro-optic materials may be used to control and tune the resonance frequency of the WGM resonator by an external control signal For example, a single lithium niobate microresonator that supports whispering gallery modes is a tunable optical filter based on the electro-optic effect of the lithium niobate material and can be used as the filter 140.

Figure 5:
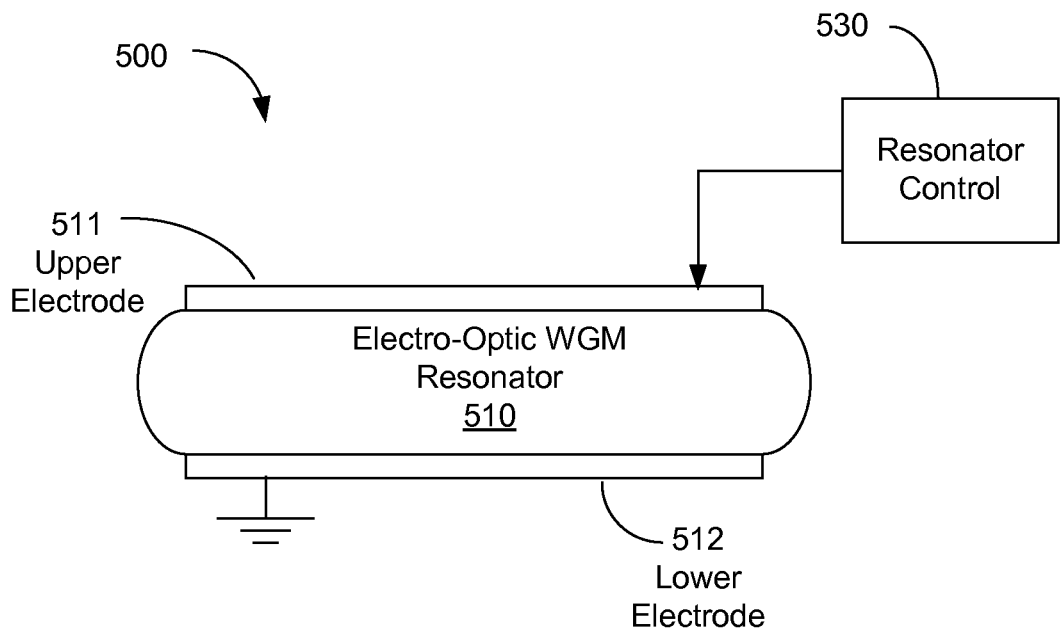
FIG. 5 shows a tunable electro-optic whispering gallery mode microresonator which may be used as a tunable optical filter.

FIG. 5 show an example of a tunable electro-optic WGM resonator 500 having a WGM resonator 510. The electro-optic material for the entire or part of the resonator 510 may be any suitable material, including an electro-optic crystal such as Lithium Niobate and semiconductor multiple quantum well structures. One or more electrodes 511 and 512 may be formed on the resonator 510 to apply a control electrical field in at least the region where the WG modes are present to control the index of the electro-optical material and to change the filter function of the resonator. Assuming the resonator 510 has disk or ring geometry, the electrode 511 may be formed on the top of the resonator 510 and the electrode 512 may be formed on the bottom of the resonator 510. In implementation, the electrodes 511 and 512 may be in various geometries to apply a control voltage to tune the resonator. For example, the electrodes 511 and 512 may be microstrip line electrodes. A tuning control unit 530 such as a control circuit may be used to supply the electrical control signal to the electrodes 511 and 512. The control voltage may be a DC voltage to set the resonance peak of the resonator 500 at a desired spectral location. The DC voltage may be adjusted by the control unit 530 to tune the spectral position of the transmission peak when such tuning is needed. For dynamic tuning operations, the control unit 530 adjusts the control voltage in response to a control signal to, e.g., maintain the transmission peak at a desired spectral position or frequency or to change the frequency of the transmission peak to a target position. In some other operations, the control unit 530 may adjust the control voltage in a time varying manner, e.g., scanning the transmission peak at a fixed or varying speed or constantly changing the transmission peak in a predetermined manner.

For example, a Z-cut $LiNbO_3$ disk cavity with a diameter of d=4.8 mm and a thickness of 170 μm may be used as the resonator 510. The cavity perimeter edge may be prepared in the toroidal shape with a 100 μm radius of curvature. As an alternative to the strip electrodes, the top and bottom surfaces of the disk resonator may be coated with conductive layers for receiving the external electrical control signal. A metal such as indium may be used to form the conductive coatings. Tuning is achieved by applying and adjusting a voltage to the top and bottom conductive coatings. Each conductive coating may be absent on the central part of the resonator and are present at the perimeter edge of the resonator where WGMs are localized.

Figure 6:
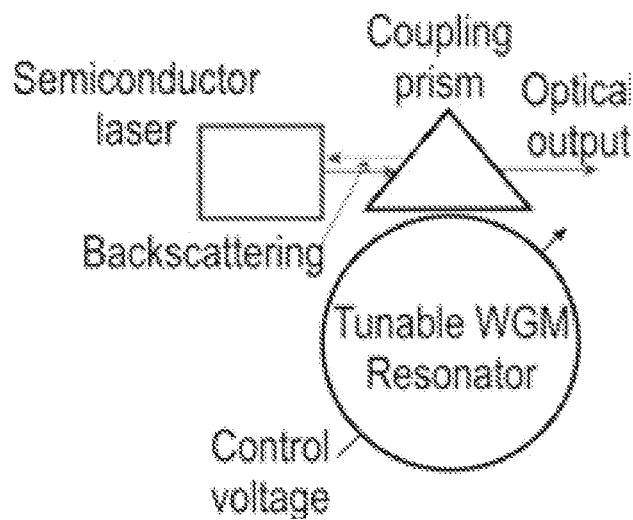
FIG. 6 shows an example of a tunable laser based on self injection locking.

Various tunable lasers can be used in the disclosed OEO devices. FIG. 6 shows one example of a tunable semiconductor laser that is locked via self injection from an optical micro-resonator made with an electro-optic material, e.g. lithium tantalate. The resonant stimulated Rayleigh scattering backed by the high quality factor of the resonator results in optical feedback to the laser at a desirable and externally tunable input laser carrier wavelength. The backscattered light returned to the diode facet of the semiconductor laser forces the diode laser to injection lock to the resonator mode. This elf injection locking is simple in structure and can be made in a compact package. Tuning of the laser can be achieved by controlling a parameter associated with the laser resonator frequency, such as an electro-optic effect, temperature control, application of strain, or any other perturbation. A self injection locked laser has narrower linewidth, larger side mode suppression, more rarified frequency and spatial mode spectra, and wider tuning range than a bare diode laser. One of the advantages of the self-injection locking laser in FIG. 6 is in its potential tunability over tens of GHz in sub-microsecond time.

As discussed above, the OEO devices disclosed here exhibit independence between the FSR of the microresonator used as the optical resonator filter and the OEO oscillation frequency. Therefore, small and light weight microresonators can be used to provide low acceleration sensitivity. The acceleration sensitivity of high performance microwave oscillators primarily results from coupling of vibration disturbances to the high Q element of the device. In the example of oscillators based on air and dielectric filled cavities, the high Q that leads to the desired low phase noise is an effective and sensitive coupling element to the acceleration induced noise. The acceleration coupling is increased by resonances corresponding to the actual size of the cavity, which typically range from one to a few inches. This results in large peaks in the phase noise spectrum, which severely degrade the output of the oscillator, and its usefulness. The only remedy currently available is to isolate the oscillator from sources of vibration, which adds to the size and complexity, and reduces the range of applications of high performance microwave oscillators to the laboratory environment.

By contrast, crystalline WGM microresonators have mm-scale dimensions, high mechanical frequencies, and high mechanical Q, and thus experience a small acceleration for a given applied force. Micro-resonators can be configured to have acceleration sensitivity along the resonator plane (x-y plane) less than $10^{-12}$/g, a negligible effect. In the z-direction, the acceleration sensitivity of a 25-micron thick WGM resonator may be configured to be in range of $10^{-12}$/g.

As illustrated in FIG. 3, optical coupling with a WGM resonator is via the evanescent wave. While fixing the amount of light coupling in a vibration environment may appear a major challenge for the stability of the oscillator, the widely tunable OEO architecture in this document can be made highly stable in frequency, e.g., below the level of $10^{-11}$. This is significantly smaller than the acceleration sensitivity of synthesizers and PLL's used for generation of microwave signals with changing frequency.

Another advantage of the disclosed OEO devices is that the operational OEO oscillation frequency can reach W-band and higher without degradation of the spectral purity of the generated signal. This happens because the quality factor of the oscillator feedback loop does not degrade with the oscillation frequency.

Referring to FIG. 3, the illustrated OEO device can be constructed as a microresonator-based tunable OEO (TOEO) based on a LiTaO3 whispering gallery mode resonator (WGMR) as an optical filter 320 in the loop. A sample oscillator based on this design was demonstrated to exhibit a wide tunability range (2-15 GHz), limited by the bandwidth of the RF amplifier, tuning speed faster than μs/GHz, phase noise less than −100 dBc/Hz measured at 10 kHz frequency offset, and noise floor of −140 dBc/Hz.

Various microresonator-based OEOs have comparably high noise floor limited by the nonlinear optical properties of the microresonators. The noise floor is determined by the optical power circulating in the loop. The optical power sent through a microresonator cannot exceed a certain threshold after which stimulated Raman scattering and other nonlinear optical processes become significant. For instance, the noise floor of some resonant TOEO can be −140 dBc/Hz while a fiber-based OEO can have noise floor lower than −160 dBc/Hz. TOEO devices disclosed here can have a potential of noise floor reduction since the devices do not require the laser light to pass through the high-Q optical resonator, as was required in all previous implementations of microresonator-based OEOs.

The OEO device in FIG. 3 can be modeled by an optical transfer function based on a single optical coupler coupled to the resonator with a fiber delay line:

$$F(\omega) = \frac{\gamma_1 - \gamma_2 + i(\omega_0 - \omega)}{\gamma_1 + \gamma_2 + i(\omega_0 - \omega)} e^{j\omega\tau}, \quad (1)$$

where $\omega$ is the frequency of the laser, $\omega_0$ is the frequency of the resonance, $\gamma_1$ is the intrinsic and $\gamma_2$ is the loading-related bandwidths of the selected WGM, $\tau$ is the fiber delay time. The amplitude of the electric field after the phase modulator is $$E_{in} \simeq E_0 e^{-i\omega t}\left[1 - \frac{b}{2}e^{i\Omega t} + \frac{b}{2}e^{-i\Omega t}\right], \quad (2)$$

where b is the (small) phase modulation coefficient, $E_0$ is the complex amplitude of the input light, and $\Omega$ is yet unknown RF oscillation frequency. Eq. (1) and Eq. (2) can be used to show that the normalized RF frequency transfer function of the RF photonic loop is $$H(\Omega) \simeq \frac{\gamma_1 + \gamma_2}{\gamma_1 + \gamma_2 + i(\Omega - \omega_0 + \omega)} e^{j\Omega\tau}. \quad (3)$$

The maximal RF transfer occurs in the case of the over-coupled microresonator ($\gamma_2 \gg \gamma_1$), when the modulation sidebands are not absorbed. The absorption of a modulation sideband does not play an important role in the device operation. The RF frequency of the maximum transmission is equal to the frequency detuning between the laser frequency and the frequency of the resonator mode. Accordingly, all slow drifts of the laser frequency will be imprinted at the RF signal. A stable laser is needed to achieve good RF phase noise at low offsets.

The oscillation frequency is given by arg[H $(\Omega)$]=$-\psi_0$, where $\psi_0$ is the RF phase shift introduced by the electronic part of the loop. Assuming that $\Omega\tau=(\Omega-\Omega_f)\tau+2\pi N$ (N is integer), $(\Omega-\Omega_f)\tau<2\pi$, $\gamma_1+\gamma_2\gg|\Omega-\omega_0+\omega_1|$, and $\psi_0=0$, the following frequency puling condition for the oscillation frequency can be derived $$\Omega_0 = \frac{\omega_0 - \omega}{1 + \tau(\gamma_1 + \gamma_2)} + \frac{\Omega_f \tau(\gamma_1 + \gamma_2)}{1 + \tau(\gamma_1 + \gamma_2)}. \quad (4)$$

The oscillator can be continuously tuned via changing the frequency of the microresonator if there is no fiber delay line in the loop. The tuning is also possible if the fiber delay line is introduced. However, it requires tuning not only the microresonator optical filter, but also the RF phase shifter. Without this phase shifter the oscillation frequency will be tuned quasi-continuously by jumping from one fiber loop-related frequency to another.

The phase noise of the oscillator can be found from $$\mathcal{L}(f) = \left|\frac{1}{1 - H(\Omega_0 + 2\pi f)}\right|^2 \quad (5)$$

$$\left[\frac{2qRP_\rho + Fk_BT}{P_{RF}} + \frac{\kappa}{f} + \frac{(2\pi f)^2}{(\gamma_1 + \gamma_2)^2 + (2\pi f)^2}(\mathcal{L}_{laser} + \mathcal{L}_{WGMR})\right].$$

where $P_{RF}$ is the demodulated averaged RF power at the photodiode output, q is the charge of an electron, R is the responsivity of the photodiode, p is the load resistance of the photodiode, P is the overall DC optical power at the photodiode, F is the noise factor of the amplifiers placed after the oscillator, $k_B$ is Boltzmann constant, T is the ambient temperature, K is the flicker noise parameter, $\mathcal{L}_{laser}$ and $\mathcal{L}_{WGMR}$ are the phase noise values for the laser and the WGMR, respectively.

The phase noise of the generated RF signal is influenced by the thermal, shot, and flicker noise on one hand, and by the phase noise of the laser as well as the microresonator, on the other. Without the microresonator the laser phase noise is cancelled at the photodiode since both the carrier and the modulation sidebands equally depend on the noise. The resonator delays the noise in a modulation sideband resulting in increase of the noise of the generated RF signal. The phase noise of the laser determines the phase noise of the TOEO if there is no fiber loop. Introduction of the fiber loop results in suppression of the overall phase noise.

A sample TOEO was made based on the design in FIG. 3 and various tests were conducted to measure the performance of the sample TOEO. A Koheras Adjustik laser operating at 1549.75 nm was used as the laser source with an output power of 9.4 mW to pump the oscillator and a phase EOM (EOspace) with 16 GHz 3 dB bandwidth was used. The fast photodetector was a 40 GHz u2t photodiode. A Hittite RF amplifier was used to amplify the output of the photodiode. A 220-m SMF-28 optical fiber was used as the fiber delay line. These components were mounted on a breadboard for a demonstration of the TOEO operation and for its characterization. The tunable optical filter was based on a packaged lithium tantalate WGM resonator fabricated by mechanical polishing of a cylindrical Z-cut $LiTaO_3$ preform. The WGM resonator was 650 μm in diameter and 100 μm in thickness and had a FSR of about 69.62 GHz. The unloaded bandwidth of the WGM resonator was around 1 MHz, the loaded bandwidth was 11 MHz. Modes with horizontal polarization were exited. The contrast was at about 90-95%. The resonator was packaged with a TEC and a thermistor and pigtailed with PM fibers. Two optical isolators (one at the input and one at the output of the resonator) were also installed. The resonator pads were traced and wire-bonded to a K connector on the package. The microresonator had golden electrodes mounted at its top and bottom surfaces. The frequency tuning was achieved by applying DC voltage to the electrodes.

To characterize the TOEO, the bias DC voltage applied to the WGMR was adjusted and the corresponding change of the frequency of the generated RF signal was measured by using an RF spectrum analyzer. The RF phase was optimized during the measurement. The tuning range of the oscillator (2-15 GHz) was limited by the RF components and, in particular, RF amplifiers used in the electronic part of the loop.

Figure 7:
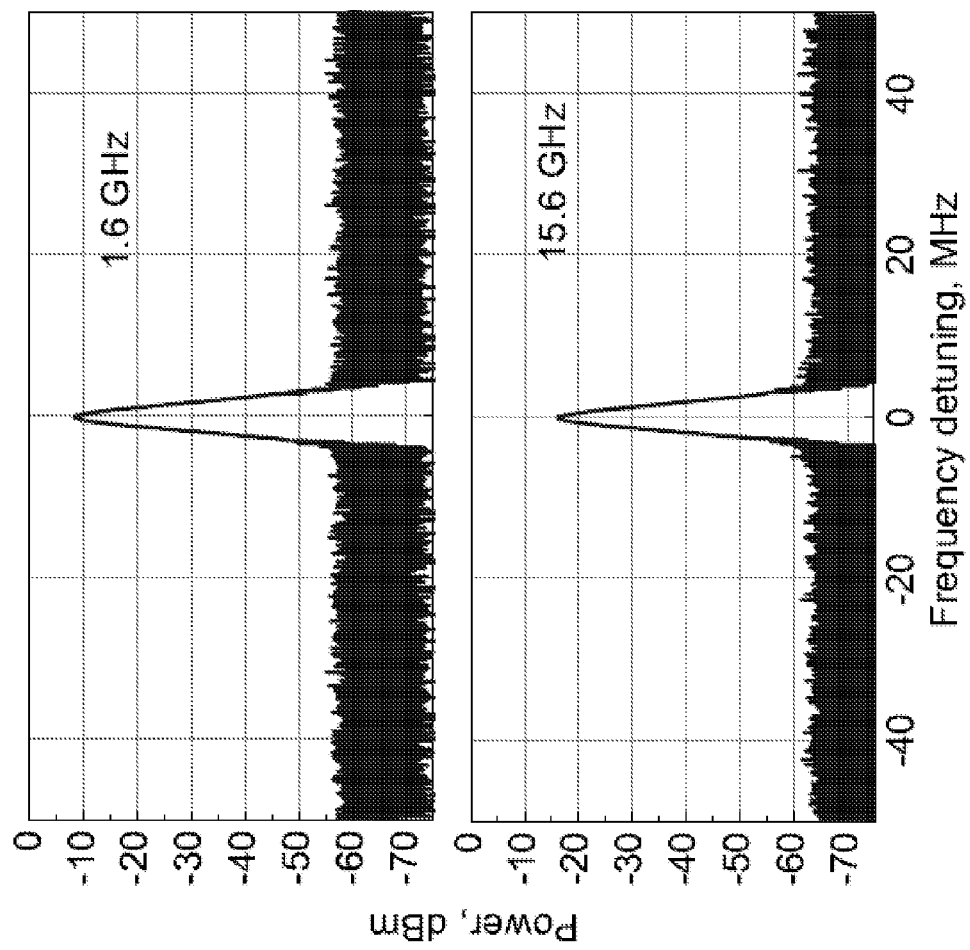
FIGS. 7-10 show measurements of sample OEO devices.
Figure 8:
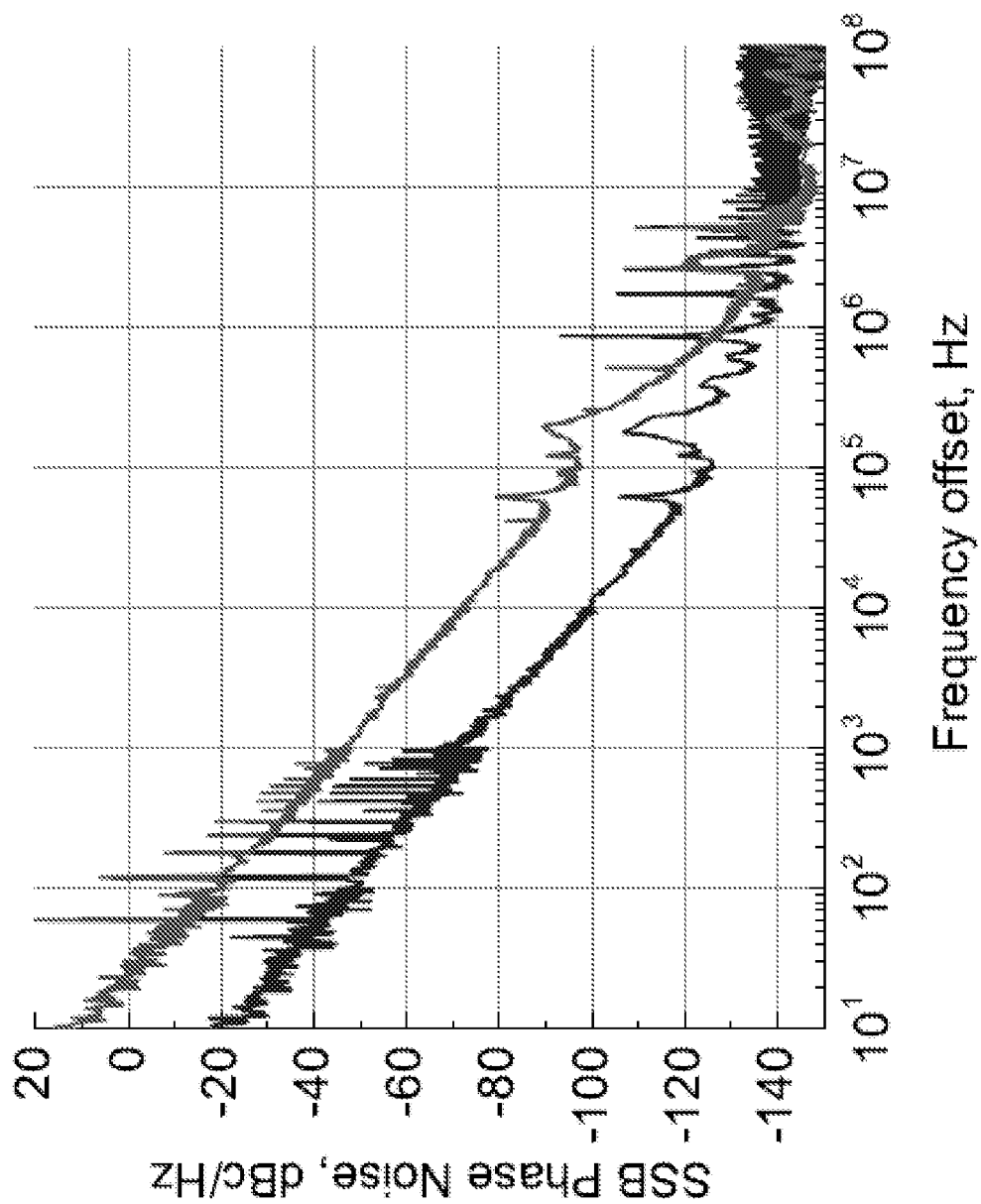
Figure 9:
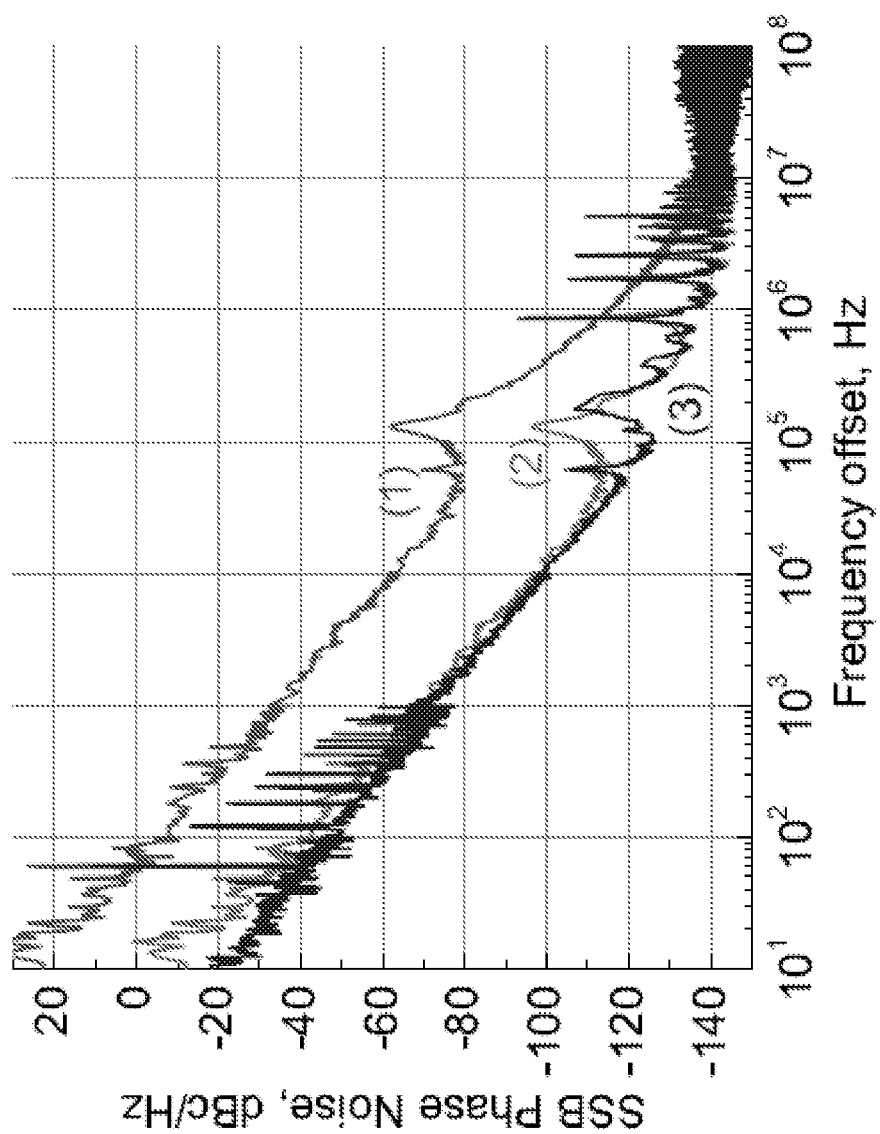

FIG. 7 shows an example of measured RF spectrum of the generated by the TOEO RF signals at 1.6 GHz (top) and 15.6 GHz (bottom) and the tenability of the device. FIGS. 8 and 9 show measured phase noise. FIG. 8 shows measured single sideband (SSB) phase noise of a sample TOEO with a total about of 6.6 m fiber between components, as illustrated by the top curve (offset from 9.8 GHz oscillation frequency), and the measured phase noise of the TOEO with 220 m of single mode fiber link added between the resonator and the photodiode (bottom blue curve, offset from 8.44 GHz). FIG. 9 shows a comparison between the phase noise calculated using theoretical model described by (Eq. 5) and the measured RF signal phase noise. The curve (1) stands for the laser noise (Llaser), which was measured by beating two lasers and recording the phase noise of the beat signal. The curve (2) is the theoretical model based on (Eq. 5) applied to a TOEO having 220 m of a fiber link and a microresonator with 11 MHz loaded bandwidth, and laser phase noise data taken as per curve (1). The curve (3) is the measured noise of the TOEO. The theoretical model and the actual RF signal phase noise are in good agreement. The deviation between model and actual noise at the 133 kHz hump is due to the second laser, which was used in the laser beat measurement, but was not used in the TOEO.

As expected, the phase noise was determined by the phase noise of the pump laser. To confirm it we beat two nearly identical lasers at a fast photodiode and evaluated laser phase noise (FIG. 9 curve (1)). We substituted then the measured value of the phase noise into Eq. (5), estimated the phase noise of the TOEO, and compared it with the results of the direct measurement (FIG. 9, curves (2) and (3)). The curves nearly coincided. The difference at the smaller closing frequency as well as in the vicinity of the relaxation oscillation peak occurs because we beat two lasers to measure laser phase noise. Therefore, the measurement data contain information about both lasers, while only one of them is used in the TOEO loop.

Figure 10:
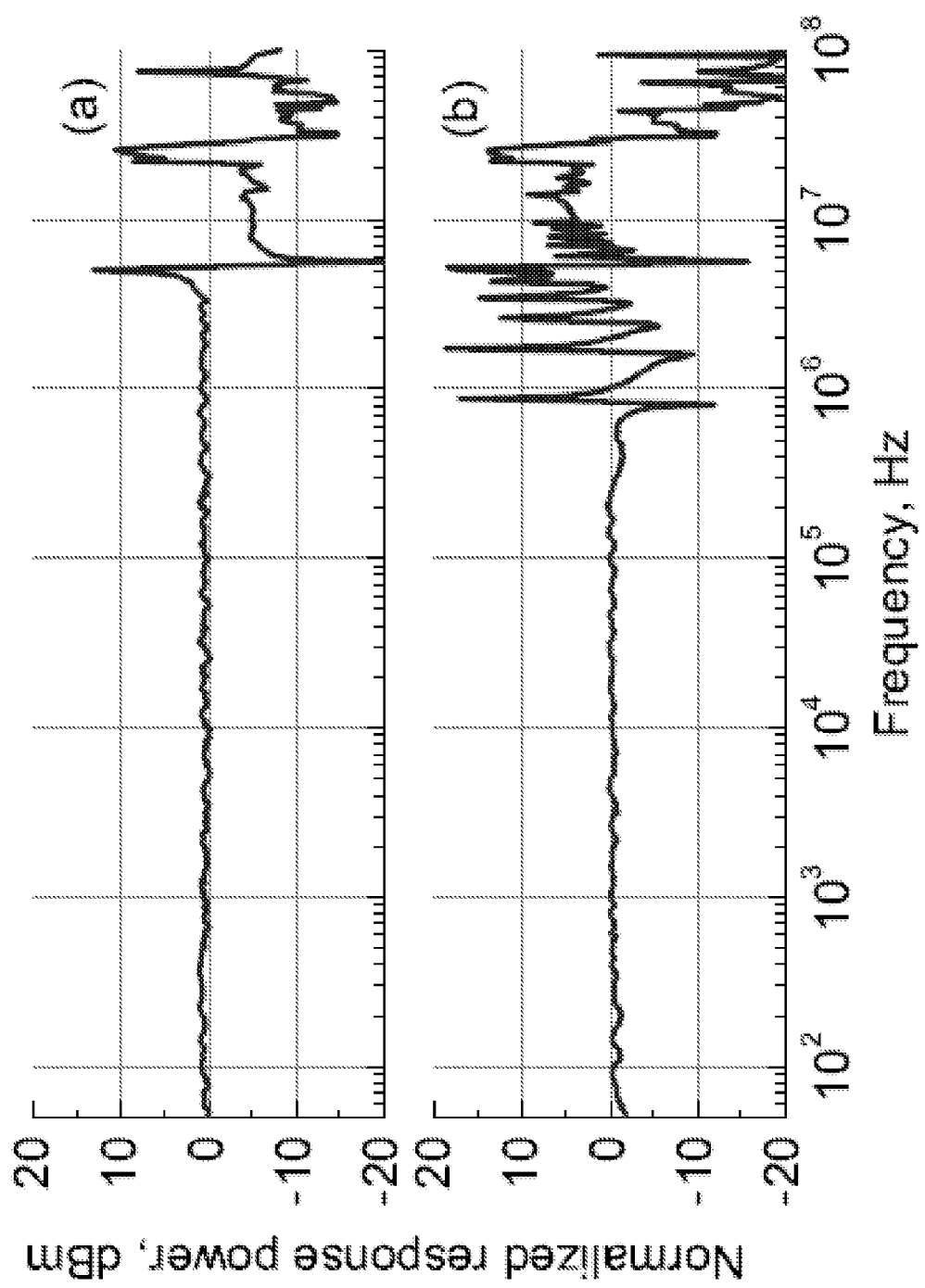

On the tuning speed of the TOEO, FIG. 10 shows the oscillation frequency excursion magnitude measurement for the closed loop TOEO (generating signal at X-band) versus the modulation frequency of the DC voltage applied to the resonator. The excursion was detected with the help of a 1 m delay line frequency discriminator and 200 MHz HP network analyzer. The top curve (a) stands for the measurement of the TOEO with a 6.6-m fiber delay line. The bottom curve (b) stands for the measurement of the TOEO with a 220-m fiber delay line. A periodic voltage signal was applied to the optical microresonator to measure the time. As the result, the TOEO frequency was modulated with approximately 1 GHz frequency excursion. The dependence of the excursion magnitude on the frequency of the voltage modulation applied to the WGMR was shown in FIG. 10. Based on the measurement, the TOEO can be switched faster than μs/GHz. The tuning speed is limited by the delay time introduced by the fiber loop.

The oscillator can be locked to an external frequency reference using a phase locked loop (PLL). The same loop can be used to tune the oscillator precisely to a desirable frequency. The tuning speed and phase noise of such an oscillator depends upon the bandwidth of the PLL loop. If the bandwidth exceeds 1 MHz, the oscillator will tune to a desired frequency in less than a microsecond. However, within the locking bandwidth, its phase noise will be limited to the phase noise of the PLL oscillator. To achieve the intrinsic low phase noise performance of the oscillator, the bandwidth of the PLL should be much to narrower, e.g. 100 Hz. Such a bandwidth will restrict the settling time for the low phase noise of the device to 10 ms.

The tested sample TOEO device can have low acceleration sensitivity if the short fiber link is tightly packaged or excluded from the package. It is possible if an ultra-narrow line microresonator-based laser is used for TOEO pumping. Such a laser could have less than 10 Hz linewidth which would allow reducing the TOEO phase noise without usage of the fiber link. The acceleration sensitivity of high performance RF oscillators primarily results from coupling of vibration disturbances to the high-Q element of the device.

The acceleration coupling is increased by resonances corresponding to the actual size of the resonator, which typically range from one to a few inches. This effect severely degrades the performance of the oscillator and diminishes its usefulness. The only remedy currently available is to isolate the oscillator from sources of vibration, which adds to the size and complexity, and reduces the range of applications of high performance RF oscillators to the laboratory environment. By contrast, crystalline WGM microresonators have mm-scale dimensions, very high mechanical frequencies, and high mechanical Q and, thus, experience a small acceleration for a given applied force. Previous studies indicate that with microresonators the acceleration sensitivity along the resonator plane (x-y plane) is less than $10^{-12}$/g (where g is the free fall acceleration constant), and is basically negligible. In the z-direction, the acceleration sensitivity of a 25-micron thick WGM resonator was calculated to be in range of $10^{-12}$/q.

A feature of the WGMR is that light is coupled in via the evanescent wave. Fixing the amount of light coupling in a vibration environment can appear a major challenge for the stability of the oscillator, it has, however, been demonstrated that the proposed design for the widely tunable OEO architecture is highly stable in frequency below the level of $10^{-11}$/g. This is significantly smaller than the acceleration sensitivity of synthesizers and PLLs used for generation of RF signals over frequency bands much smaller than that of the demonstrated device.

While this patent document contains many specifics, these should not be construed as limitations on the scope of any invention or of what may be claimed, but rather as descriptions of features that may be specific to particular embodiments of particular inventions. Certain features that are described in this patent document in the context of to separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:
1. An opto-electronic oscillator device, comprising:
a laser to emit laser light at a laser carrier frequency;
an optical modulator that receives the laser light from the laser and modulates the received laser light, under a control of and in response to a modulation control signal, to produce modulated laser light having spectral com- ponents at the laser carrier frequency and modulation sidebands at frequencies different from the laser carrier frequency;

an optical resonator filter positioned to receive the modulated laser light at a selected modulation sideband in resonance with an optical mode of the optical resonator filter to selectively receive and output filtered laser light at the selected modulation sideband while blocking laser light at the laser carrier frequency and other modulation sidebands from entering the optical resonator filter;

an optical detector coupled to receive the filtered laser light at the selected modulation sideband and the laser light at the laser carrier frequency and other modulation sidebands to produce an electrical detector signal; and a feedback electronic circuit coupled between the optical detector and the optical modulator to amplify the electrical detector signal and to produce an electrical feedback signal as the modulation control signal that is fed into the optical modulator to produce a total signal gain greater than a total signal loss in a closed opto-electronic loop that includes (1) an optical section including the optical modulator, the optical resonator filter and the optical detector and (2) an electronic section including the optical detector and the feedback electronic circuit to sustain an oscillation in the closed opto-electronic loop, wherein the optical section and the electronic section are configured to render an oscillation frequency of the oscillation to be independent of a free spectral range of the optical resonator filter.

2. The device as in claim 1, wherein:
the feedback electronic circuit includes a signal amplifier that amplifies the electrical detector signal and a phase rotator that adjusts a phase of the electrical detector signal.

3. The device as in claim 1, wherein:
the laser is a tunable laser operable to change a value of the laser carrier frequency so as to tune an oscillation frequency of the oscillation in the closed opto-electronic loop.

4. The device as in claim 3, comprising:
a phase lock loop circuit coupled to the electronic feedback circuit and the tunable laser to lock the oscillation frequency with respect to a reference frequency of an external frequency source.

5. The device as in claim 3, wherein:
the tunable laser includes a semiconductor laser, an optical resonator optically coupled to the semiconductor laser to receive the laser light and to direct light in the optical resonator back to inject into the semiconductor laser to lock the semiconductor laser and the optical resonator to each other in frequency, and
the optical resonator is a tunable optical resonator which can be tuned to change the laser carrier frequency produced by the semiconductor laser.

6. The device as in claim 5, wherein:
the optical resonator is a tunable optical whispering gallery mode resonator formed of an electro-optic material.

7. The device as in claim 1, comprising:
a phase lock loop circuit coupled to the closed opto-electronic loop to lock the oscillation frequency with respect to a reference frequency of an external frequency source.

8. The device as in claim 1, wherein:
the optical resonator filter includes an optical whispering gallery mode resonator.

9. The device as in claim 1, wherein:
the optical resonator filter is tunable in frequency to change a value of a resonance of the optical resonator filter so as to tune an oscillation frequency of the oscillation in the closed opto-electronic loop.

10. A method for generating an oscillation signal, comprising:

operating an optical modulator to respond to a modulation control signal to perform optical modulation on laser light at a laser carrier frequency to produce modulated laser light having a spectral component at the laser carrier frequency and spectral components at modulation sidebands at frequencies different from the laser carrier frequency;

coupling light at a selected modulation sideband in the modulated laser light into an optical resonator filter which is in optical resonance with the selected modulation sideband to produce filtered laser light at a frequency of the selected modulation sideband while blocking laser light at the laser carrier frequency and laser light at other modulation sidebands from entering the optical resonator filter;

operating an optical detector to receive the filtered laser light at the selected modulation sideband and laser light at the laser carrier frequency and other modulation sidebands to produce an electrical detector signal; and operating a feedback electronic circuit to process the electrical detector signal to produce the modulation control signal that is fed into the optical modulator, wherein the processing of the electrical detector signal produce a total signal gain greater than a total signal loss in a closed opto-electronic loop that includes (1) an optical section including the optical modulator, the optical resonator filter and the optical detector and (2) an electronic section including the optical detector and the feedback electronic circuit to sustain an oscillation in the closed opto-electronic loop.

11. The method as in claim 9, comprising:
operating the optical section and the electronic section to render an oscillation frequency of the oscillation to be independent of a free spectral range of the optical resonator filter.

12. The method as in claim 9, comprising:
operating the feedback electronic circuit to amplify the electrical detector signal and to adjust a phase of the electrical detector signal for sustaining the oscillation.

13. The method as in claim 9, comprising:
tuning the laser carrier frequency to tune an oscillation frequency of the oscillation in the closed opto-electronic loop.

14. The method as in claim 9, comprising:
tuning a resonance of the optical resonator filter to tune an oscillation frequency of the oscillation in the closed opto-electronic loop.

15. An opto-electronic oscillator device, comprising:
a laser to emit laser light at a laser carrier frequency;
an optical modulator that receives the laser light from the laser and modulates at least a phase of the received laser light, in response to a modulation control signal, to produce modulated laser light having strong laser light at the laser carrier frequency and weak laser light at modulation sidebands at frequencies different from the laser carrier frequency;
an optical whispering gallery mode resonator filter positioned to receive the modulated laser light from the optical modulator and configured to be in optical resonance with a selected modulation sideband of the modulated laser light to selectively receive and output filtered laser light at the selected modulation sideband while blocking laser light at the laser carrier frequency and other modulation sidebands from entering the optical whispering gallery mode resonator filter;

an optical detector coupled to receive the filtered laser light at the selected modulation sideband and laser light at the laser carrier frequency and other modulation sidebands to produce an electrical detector signal; and a feedback electronic circuit coupled between the optical detector and the optical modulator to include an amplifier that amplifies the electrical detector signal and a phase rotator that adjusts a phase of the electrical detector signal to produce the modulation control signal that is fed into the optical modulator, wherein the feedback electronic circuit is configured to produce a total signal gain greater than a total signal loss in a closed opto-electronic loop that includes (1) an optical section including the optical modulator, the optical resonator filter and the optical detector and (2) an electronic section including the optical detector and the feedback electronic circuit to sustain an oscillation in the closed opto-electronic loop, and wherein the laser or the optical whispering gallery mode resonator filter is tunable in frequency to tune an oscillation frequency of the oscillation in the closed opto-electronic loop, wherein the optical section and the electronic section are configured to render an oscillation frequency of the oscillation to be independent of a free spectral range of the optical resonator filter.

16. The device as in claim 15, wherein:

the laser includes a semiconductor laser, an optical resonator optically coupled to the semiconductor laser to receive the laser light and to direct light in the optical resonator back to inject into the semiconductor laser to lock the semiconductor laser and the optical resonator to each other in frequency, wherein the optical resonator is a tunable optical resonator which can be tuned to change the laser carrier frequency produced by the semiconductor laser.

17. The device as in claim 15, wherein:

the optical whispering gallery mode resonator is formed of an electro-optic material and is tunable in frequency.

18. The device as in claim 15, comprising:

a phase lock loop circuit coupled to the closed opto-electronic loop to lock the oscillation frequency with respect to a reference frequency of an external frequency source.

* * * * *